United States Patent [19]

Bodenhausen et al.

[11] Patent Number: 5,285,159

[45] Date of Patent: Feb. 8, 1994

[54] RF PULSE CASCADE FOR THE GENERATION OF NMR SPECTRA

[75] Inventors: Geoffrey Bodenhausen, Pully; Lyndon Emsley, Lausanne, both of Switzerland

[73] Assignees: Spectrospin AG, Ind., Fallanden; Bruker Analytische Messtechnik GmbH, Rheinstetten

[21] Appl. No.: 852,235

[22] PCT Filed: Oct. 6, 1990

[86] PCT No.: PCT/EP90/01681

§ 371 Date: Jun. 1, 1992

§ 102(e) Date: Jun. 1, 1992

[87] PCT Pub. No.: WO91/09322

PCT Pub. Date: Jun. 27, 1991

[30] Foreign Application Priority Data

Dec. 8, 1989 [DE] Fed. Rep. of Germany ....... 3940633

[51] Int. Cl.$^5$ .............................................. G01V 3/00
[52] U.S. Cl. .................................. 324/314; 324/307
[58] Field of Search ............... 324/314, 300, 307, 309, 324/311, 312

[56] References Cited

U.S. PATENT DOCUMENTS

| | | | |
|---|---|---|---|
| 4,682,106 | 7/1987 | Vatis et al. | 324/307 |
| 4,710,718 | 12/1987 | Shaka | 324/314 |
| 4,733,186 | 3/1988 | Oppelt | 324/309 |
| 4,746,863 | 5/1988 | Crooks et al. | 324/309 |
| 4,757,260 | 7/1988 | Tsuda | 324/309 |
| 4,774,467 | 9/1988 | Sorensen | 324/311 |
| 4,818,940 | 4/1989 | Hennig | 324/309 |
| 4,878,021 | 10/1989 | Granot | 324/309 |
| 5,126,671 | 6/1992 | Bodenhausen et al. | 324/314 |

OTHER PUBLICATIONS

Proceedings of the Fourth Annual Meeting of the Society of Magnetic Resonance in Medicine, London, Aug. 1985, p. 958 ff, Conolly et al.: Selective Pulse Design Via Optimal Control Theory.

Journal of Magnetic Resonance, 74, 226-263 (1987) Murdoch et al.: Computer-Optimized Narrowband Pulses for Multislice Imaging.

Magnetic Resonance in Medicine, 5, 217-237 (1987) Nago et al.: General Solution to the NMR Excitation Problem for Noninteracting Spins.

*Primary Examiner*—Louis Arana
*Attorney, Agent, or Firm*—Thomas R. Vigil

[57] ABSTRACT

A method for generating a spectrum of NMR signals with rectangular characteristic in the frequency space by radiating a sequence of RF pulses onto a sample in the homogeneous magnetic field is presented. The RF pulses of the sequence are amplitude modulated and the enveloping function of the sequence consists of a superposition of bell-curve-shaped RF pulses with optimized positions of the maxima, pulse widths and peak amplitudes. The response signals, in dependence on the standardized frequency, shift, approximate virtually ideally, a rectangular function. The method is applicable with success especially in image generation for NMR tomography, in multidimensional NMR spectroscopy, as well as in volume selective NMR spectroscopy.

18 Claims, 7 Drawing Sheets

RF PULSE CASCADE FOR THE GENERATION OF NMR SPECTRA

The invention relates to a method for generating a spectrum of nuclear magnetic resonance signals by radiating a sequence of n RF pulses onto a sample which is present in a homogeneous static magnetic field, in which the envelope of the nuclear magnetic resonance signal response in the frequency space is approximately a rectangular function.

The capacity for the excitation or inversion of nuclear spins over a selected band of frequencies has become an important part in many experiments in modern nuclear magnetic resonance. In high resolving NMR spectroscopy it is often desirable to restrict the width of the relevant frequency domains, especially in two and three dimensional spectroscopy. Frequency selective excitation is also an integral component of a whole class of experiments in which two or three dimensional spectra are compressed into one dimension. The perhaps most important application of selective excitation are the methods for NMR imaging. In this context, two especially important problems are to be mentioned, namely the inversion over a well defined rectangular window in the frequency spectrum and the excitation of transverse magnetization with minimal phase dispersion proceeding from longitudinal magnetization, again over a rectangular window in the frequency spectrum.

Among the numerous methods that were proposed by different authors for rectangular inversion and excitation, a large number are based on the use of composite pulses that consist of trains of hard pulses which are phase shifted against one another, but have rectangular envelopes and constant amplitudes. Other processes for rectangular inversion and excitation use amplitude and/or phase modulation. In the further discussion there are to be considered only pulses with purely amplitude modulated envelopes. For the spin inversion, it is possible to use radio frequency (RF) pulses whose envelopes can be described by simple analytic functions, such as, for example, Gaussian, Sinc or Hermite functions. The only known amplitude modulated pulse for in-phase excitation with an envelope that can be described by analytical function is a Gaussian pulse with 270° on-resonance flip angle. Although with this pulse the above problems can be partly solved, in the case of demanding applications, due to residual phase dispersion and the deficient selectivity, there still remain unsolved problems.

Latest strivings for the optimization of formed pulses were based on the division of an arbitrary envelope in the time domain into many discrete intervals and the variation of the RF amplitude in each individual interval until the signal response approximates a target function. For this purpose, various degrees of refinements were introduced, among others, the optimal regulating technique of Conolly et al. in "Proceedings of the Fourth Annual Meeting of the Society of Magnetic Resonance in Medicine, London, August 1985, pp. 958 ff", the conjugated gradient method of Murdoch et al. in "J. Magn. Reson." 74, 226 (1987) and the linearization of the Bloch equations according to Ngo et al. in "Magn. Reson. Med." 5, 217 (1987).

These processes lead, to be sure, to excellent results. Those of Ngo et al. approach rather close to an ideal signal response. The resulting envelopes, however, require between 100 and 500 independent parameters for their definition, so that their practical application becomes extremely complicated.

An object of the present invention is, therefore, to present a process for generating a spectrum of nuclear magnetic resonance signals by radiating a sequence of n RF pulses onto a sample which is located in a homogeneous static magnetic field, in which the envelope of the nuclear magnetic resonance signal response in the frequency space is approximately a rectangular function, in which, by a sequence of n RF pulses with as few adjustable parameters as possible, a nuclear magnetic resonance spectrum is generated with rectangular characteristics in frequency space.

This problem is solved according to the invention by the means that the n RF pulses of the sequence are amplitude-modulated and their respective amplitude distributions follow approximately the form of bell curves, and that, in advance, the amplitude distribution of the entire pulse sequence has been determined in a suitable optimization procedure under the criterion of a minimizing of the deviation of the envelope of the nuclear magnetic resonance signal response in the frequency space from a rectangular function by variation of 3·n parameters $w_k^{max}$, $t_k^{max}$, $a_k$, in which $w_k^{max}$ signifies the relative amplitude of the k-th pulse of the sequence at the position $t_k^{max}$ of its extremum and $a_k$, the width of the k-th pulse.

The pulse sequence comprises a superposition of well known, easily reproducible RF pulses, whose number n is limited to at most ten, which in every case suffices for an optimal approximation of the envelope of the signal response to a rectangular function. The total number of free parameters to be controlled does not exceed 3·n.

The optimization of the sequence of bell curved shaped RF pulses according to the invention occurs in advance in a manner known per se by variation of the parameters $w_k^{max}$, $t_k^{max}$ and $a_k$ characterizing the bell shaped curves, which are varied until the deviation of the envelope of the nuclear magnetic resonance signal response in the frequency space from a rectangular function is minimal. Since the optimization has to be carried out only once and then the optimal parameters for the amplitude distribution $w_k(t)$ are established, the rapidity of the optimizing procedure plays no role. In principle, the parameters could also be determined by more or less qualified guessing, by trial or by a simple iteration carried out "by hand".

The minimization of the deviation of the envelope of the nuclear magnetic resonance signal response in the frequency space from a rectangular function is especially simply and conveniently accomplished by use of a numerical fit program on an automatic data processing installation.

In an advantageous development of the method of the invention the minimizing of the deviation of the envelope of the nuclear magnetic resonance response in the frequency space from a rectangular function is accomplished by optimizing of a given error function which describes the deviation of the envelope from a rectangular function. The optimization can be broken off when the error function exceeds a predetermined limit value.

The bell curve shaped RF pulses of the sequence can generally also be slightly asymmetrical. In a special form of performing the method of the invention the sequence contains RF pulses whose amplitude distribution follows the form of a Lorentz curve. Especially preferred is a form of execution in which the amplitude distributions of the RF pulses follow the form of Gaussian curves. The special parameter values mentioned below were determined especially for Gaussian pulse cascades and led to especially good results.

In a special development of the method of the invention the number of RF pulses per sequence is n=3. Therewith there is yielded a pulse sequence which is particularly well suited for the selective inversion of nuclear magnetic moments.

The envelope of the inversion signal response, with use of the method of the invention, comes particularly close to a rectangular function when the parameters $w_k^{max}$, $t_k^{max}/t_p$ and $\Delta t_k^{\frac{1}{2}}/t_p$ take on in each case a corresponding value from the interval $$1,2 < W_2^{max}/W_1^{max} < 1,5;\ 0,3 < W_3^{max}/W_1^{max} < 0,7$$

$$15 < \Delta t_1^{\frac{1}{2}}/t_p < 25;\ 15 < t_2^{\frac{1}{2}}/t_p < 25;$$

$$20 < \Delta t_3^{\frac{1}{2}}/t_p < 30;\ 20 < t_1^{max}/t_p < 40;$$

$$40 < t_2^{max}/t_p 60;\ 70 < t_3^{max}/t_p < 90$$

in which $\Delta t_k^{\frac{1}{2}}$ is half the pulse width of the k-th pulse at the half pulse amplitude $w_k^{max}/2$ and $a_k = \ln 2/(\Delta t_k^{\frac{1}{2}})^2$, especially when the parameters take on in each case the value $$W_1^{max} = -1,00;\ W_2^{max} = 1,37;\ W_3^{max} = 0,49;$$

$$\Delta t_1^{\frac{1}{2}}/t_p = 18,9;\ \Delta t_2^{\frac{1}{2}}/t_p = 18,3;\ \Delta t_3^{\frac{1}{2}}/t_p = 24,3;$$

$$t_1^{max}/t_p = 28,7;\ t_2^{max}/t_p = 50,8;\ t_3^{max}/t_p = 79,5$$

With use of n=4 RF pulses in the pulse sequence $w_1$(t) the method of the invention is especially well suited for the in-phase excitation of transverse magnetization. An especially good result is achieved when the parameters $w_k^{max}$, $t_k^{max}/t_p$ and $\Delta t_k^{\frac{1}{2}}/t_p$ take on in each case a corresponding value from the interval $$0,95 < W_2^{max}/W_1^{max} < 1,35;$$
$$-1,7 < W_3^{max}/W_1^{max} < -1,3;$$

$$-0,7 < W_4^{max}/W_1^{max} < -0,4;$$

$$15 < \Delta t_1^{\frac{1}{2}}/t_p < 20;\ 10 < \Delta t_2^{\frac{1}{2}}/t_p < 15;\ 10 < \Delta t_3^{\frac{1}{2}}/t_p < 15;$$

$$10 < \Delta t_4^{\frac{1}{2}}/t_p < 20;$$

$$5 < t_1^{max}/t_p < 25;\ 40 < t_2^{max}/t_p < 60;$$
$$55 < t_3^{max}/t_p < 75;$$

$$75 < t_4^{max}/t_p < 95$$

in particular the values $$W_1^{max} = 0,62;\ W_2^{max} = 0,72;\ W_3^{max} = -0,91;$$

$$W_4^{max} = 0,33;$$

$$\Delta t_1^{\frac{1}{2}}/t_p = 17,2;\ \Delta t_2^{\frac{1}{2}}/t_p = 12,9;$$

$$\Delta t_3^{\frac{1}{2}}/t_p = 11,9;\ \Delta t_4^{\frac{1}{2}}/t_p = 13,9;$$

$$t_1^{max}/t_p = 17,7;\ t_2^{max}/t_p = 49,2;\ t_3^{max}/t_p = 65,3;$$

$$t_4^{max}/t_p = 89,2$$

Especially advantageous is the use of the method of the invention as a component of imaging methods, especially in NMR tomography, in multidimensional NMR spectroscopy and especially for volume-selective NMR spectroscopy. The sequences of n RF pulses according to the invention can be part of a NOESY pulse sequence or part of a COSY pulse sequence.

The invention relates also to an NMR spectrometer with an RF pluse generator and an arrangement for the drive of the RF pluse generator, the arrangement comprising a memory for the storage of data sets for the generation of RF pluse sequences wherein the memory comprises a data set for the generation of a pulse sequence with a number n of at least 2 but not more than 10 amplitude modulated bell shaped RF pulses, each RF pulse comprising an amplitude $w_k^{max}$, an extremum position $t_k^{max}$, and a width $a_k$ and, in advance, the amplitude distribution of the entire pulse sequence has been determined in a suitable optimization procedure under a criterion of a minimization of a deviation of an envelope of a nuclear magnetic resonance signal response in frequency space from a rectangular function by variation, for each pulse, of $w_k^{max}$, $t_k^{max}$, and $a_k$. Such a spectrometer can be further developed so that the above-described developments of the method of the invention can be carried out on it.

The invention is described in detail with the aid of the embodiments represented in the drawings. The features to be learned from the specification, the tables and drawings can be used in other embodiments of the invention individually by themselves or collectively in arbitrary combination.

FIG. 1 shows Fourier transforms (in broken lines) together with the numerically calculated transverse magnetization $<M_{xy}>$ (solid line) of Gaussian pulse cascades, whose three individual pulses yield the nominal flip angle +45°, −90°, +135°, in which (a) each individual pulse has a width proportional to the flip angle; or (b) the individual pulses have equal widths and amplitudes proportional to the flip angle.

FIG. 2 shows a comparison of the $M_z$ responses of the inversion pulses whose envelope (is)

(a) a single Gaussian pulse;

(b) a Sinc pulse; and (c) a Gaussian pulse cascade according to the invention with n=3.

(a) the start function with n=4 and the corresponding $M_{x'}$- and $M_{y'}$- profiles after an in-phase excitation; and (b) the optimized excitation cascade and the corresponding optimized signals.

Figure 6A:
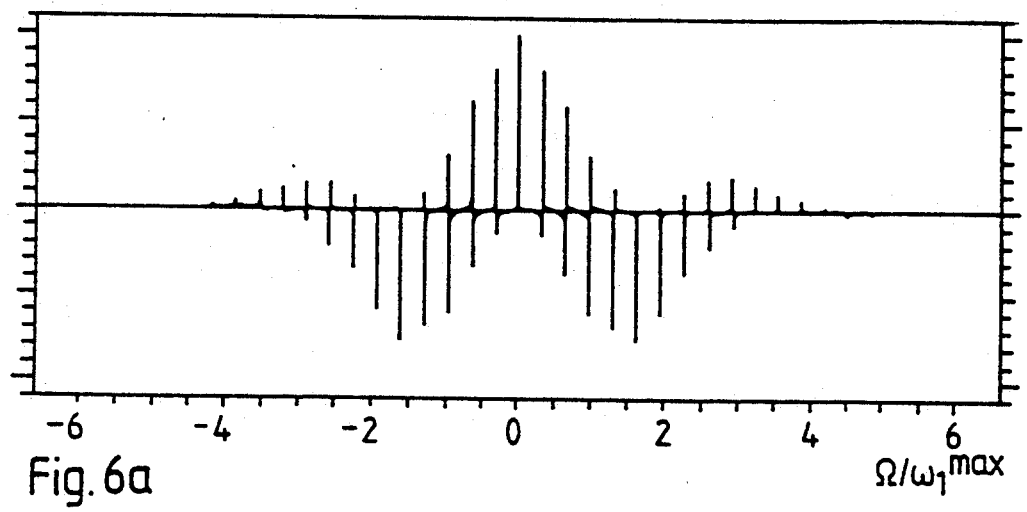
Figure 6B:
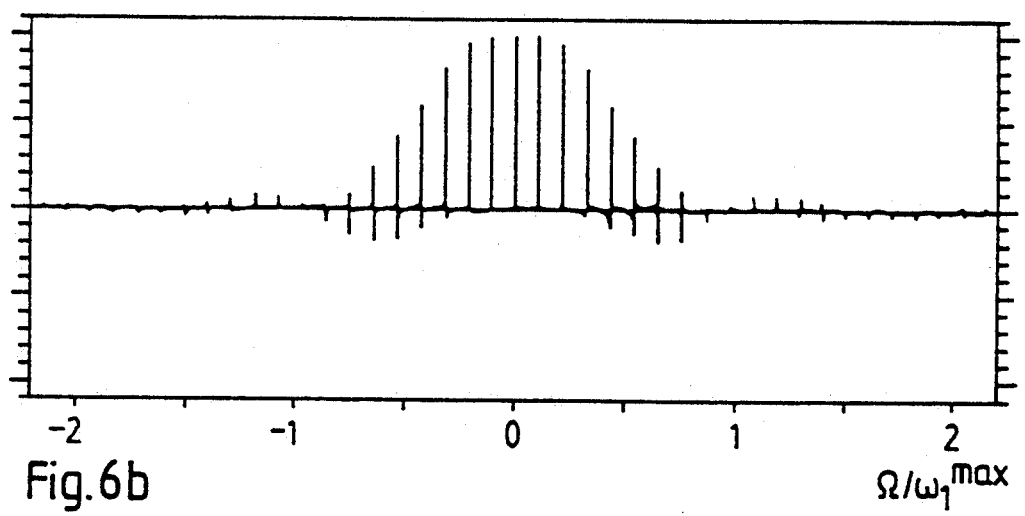
Figure 6C:
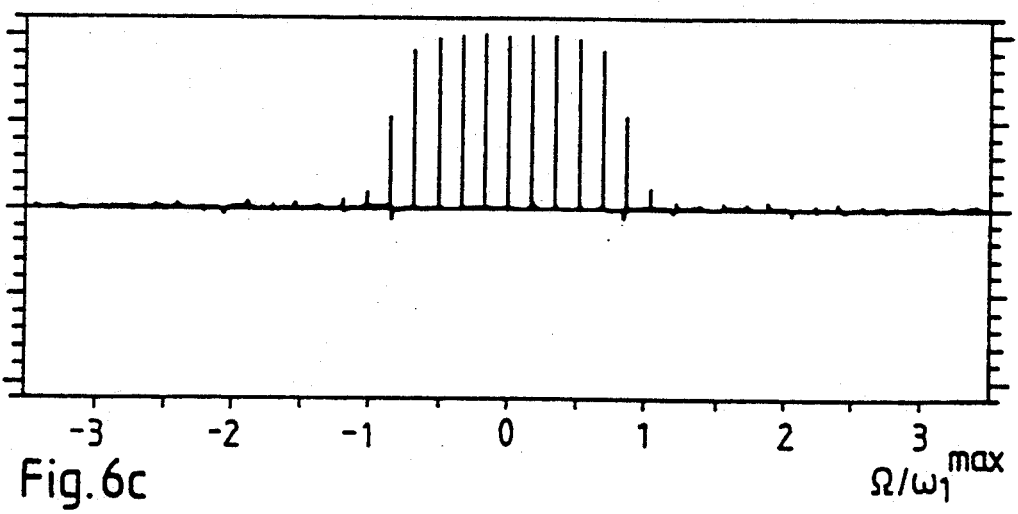

FIG. 5 shows:

(a) the experimental result of an inversion cascade n=3 (above), as well as the result of a simulation of this experiment (below);

(b) the experimental result of an excitation cascade n=4 (above), as well as the corresponding simulation calculation (below); and FIG. 6 shows a comparison of the simulated behavior (a) of a 90° Gaussian pulse;

(b) of a 270° Gaussian pulse; and (c) of an excitation pulse cascade according to the invention (n=4).

Figure 7:
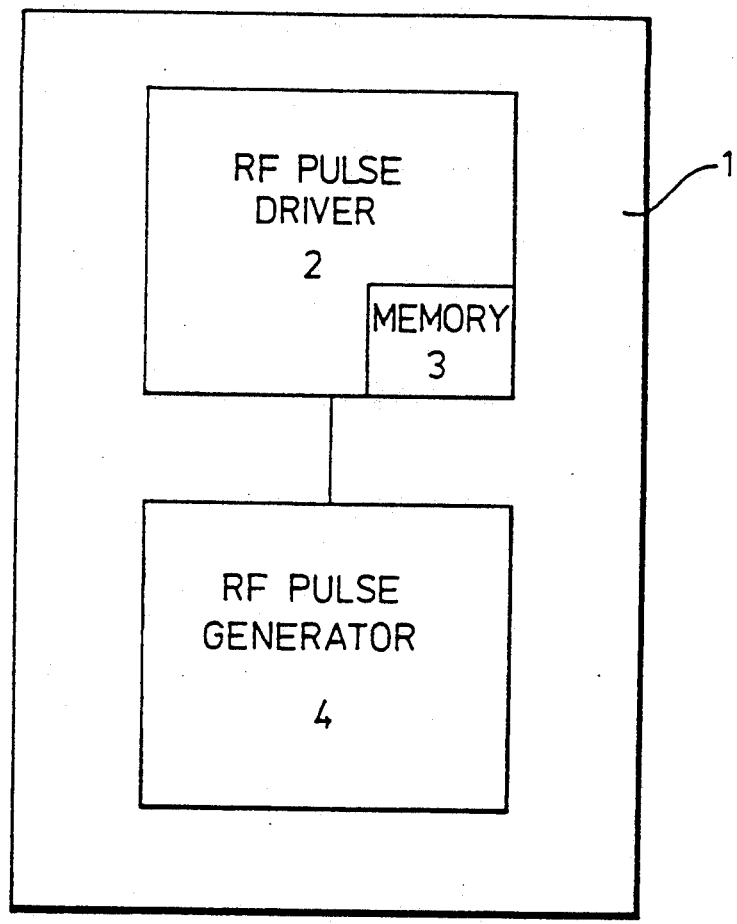

FIG. 7 shows a schematic diagram of an NMR spectrometer according to the invention.

For small flip angles the frequency response of the spin system corresponds approximately to the Fourier transform of the envelope of the pulse in the time domain. Far off-resonance where the magnetization trajectories are effectively confined to small excursions in the vicinity of the "north pole" of the reference system, it has been shown that the above equivalence holds even for large effective flip angles. For the prediction of the on-resonance behavior in the case of large flip angles such as are required for inversion, refocussing or even for efficient excitation of the transverse magnetization, the equivalence, however, completely collapses. Although, therefore, pulses with Gaussian or Sinc envelopes may have useful properties, these should not be attributed to the fact that the Fourier transforms of these envelopes have the form of Gaussian and rectangular functions in the frequency domain.

In the following there is introduced a new class of amplitude modulated pulses which are useful especially both for the selective inversion, as well as for in-phase excitation, and which are described by the analytical form:

$$W(t) = \sum_{k=1}^{n} [W_k^{max} \exp\{-a_k(t - t_k^{max})^2\}] \pi(0, t_p) \quad [1]$$

This function represents an envelope of the time duration $t_p$ and consists of a superposition of n Gaussian functions, in which for the k-th Gaussian function the position of the extremum is given by $t_k^{max}$, the peak amplitude by $w_k^{max}$ and the width by $$a_k = \ln 2/(\Delta t_k^{\frac{1}{2}})^2 \quad [1a]$$

and $\Delta t_k^{\frac{1}{2}}$ is half the pulse width of the k-th pulse in the half pulse amplitude. The function $\pi(0, t_p)$ represents a box function with the value 1 between $t=0$ and $t_p$ and the value 0 everywhere otherwise.

Since the Fourier equivalence is valid for large frequency offsets from resonance, the Fourier transforms of an ideal pulse cascade must lie outside the relevant band width as near as possible to 0. Abrupt variations of the amplitude, therefore, should be avoided, because they lead to erratic Fourier transforms. For this reason the pulse forms of the individual pulses in the cascade were chosen as Gaussian functions in contrast to the otherwise usual rectangular envelopes. Furthermore, the form of the Fourier transform of a pulse is influenced not by the amplitude but only by its width. As direct consequence of the addition and displacement theorems it can be shown that a cascade of n shifted Gaussian pulses with identical widths ($a_k = a$ for all k) and variable amplitudes has a Fourier transform that consists of a sum of n Gaussian envelopes with identical widths (and variable amplitudes):

$$s(t) = \sum_{k=1}^{n} W_k^{max} \exp\{-a(t - t_k^{max})^2\} \quad [1b]$$

$$S(\Omega) = \sum_{k=1}^{n} (\pi/a)^{\frac{1}{2}} W_k^{max} \exp\{-it_k^{max}\Omega\} \exp\{-\Omega^2/(4a)\} \quad [2]$$

The frequency-domain Gaussian pulses will therefore simply be associated with different phases which reflect the time shifts in the cascade. From this it can be perceived that the output sequence for a Gaussian cascade should have individual pulses with equal widths $a_k$ and amplitudes $\Omega_k^{max}$ which vary according to the desired nominal flip angles. In this manner, it can be expected that the excitation will decline like that of a single Gaussian pulse.

Figure 1B:
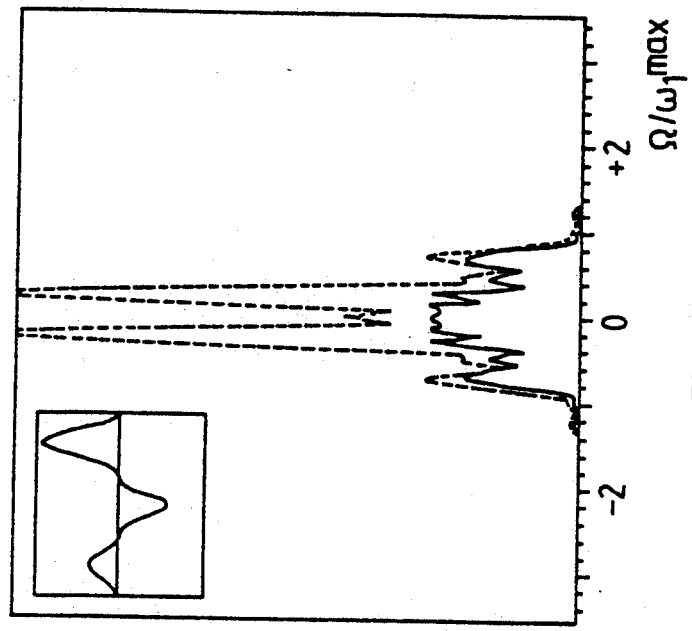
Figure 1A:
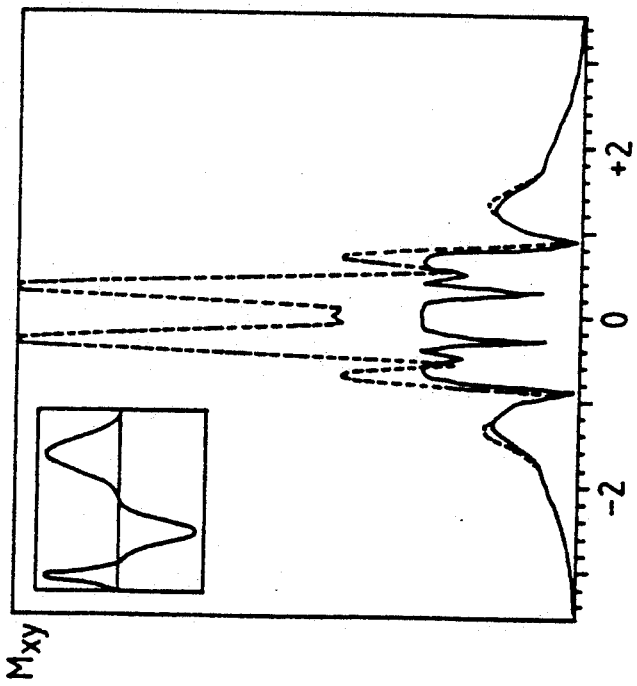

For the demonstration of this argument, FIG. 1 shows the Fourier transforms together with numerical simulations of the $<M_{xy}>$ responses to two Gaussian pulse cascades whose individual pulses in each case have nominal on-resonance flip angles of $+45°$, $-90°$ and $+135°$. If the amplitudes are constant and the widths are proportional to the flip angles, it is obvious that the tails in the excitation profiles go very slowly to zero. In contrast to this, a cascade of Gaussian pulses with equal pulse widths, but amplitudes proportional to the flip angles leads to a response which decays very much more rapidly. One should also note that the Fourier transform does not directly predict the on-resonance behavior. Although the principle of amplitude modulation in contrast to modulation of the pulse duration can be extended easily to pulse cascades with arbitrary phase shift, at the moment there should be considered only pulse trains with constant phase, in which, to be sure, phase reversal (for example, from x to $-x$) is to be allowed. The pulse responses in FIG. 1 are represented as a function of the reduced frequency offset $\Omega/w_1^{max}$, in which $\Omega = W_0 - W_{RF}$ and $w_1^{max}$ are the frequency offset and the maximal RF amplitude of the 90° pulse.

The pulses were optimized on the computer with a modified Simplex procedure, in which the deviation from a rectangular target function was minimized. It should be noted that the above mentioned Fourier conditions are sufficient for the desired off-resonance behavior, but are by no means necessary. It can well be that cascades with unequal pulse widths $a_k$ likewise lead to good quality response signals. For this reason the optimization was carried out with all the independent parameters of equation (1). The minimizing of the error of a pulse response which satisfies the Bloch equations is rendered especially difficult by the presence of a large number of shallow false minima. This problem is solved most simply by redefinition of the form of the error function during the optimization procedure.

As a starting value for a pulse cascade with three pulses, the following sequence was chosen:

$$G\{270°_{-x}\} \; G\{270°_x\} \; G\{180°_x\} \quad [3]$$

The sequence consists of a simple preparation cycle, which is followed by an ordinary inversion pulse. The $G(270°_{-x}) G(270°_x)$ cycle has no net effect in the region of the resonance, but prepares the off-resonance magnetization in a favorable manner for the subsequent action of the 180° pulse for the generation of a rectangular inversion profile. In view of the considerations in regard to the Fourier transforms, all three Gaussian pulses were chosen with the same width but with amplitudes proportional to the flip angles.

Figure 2C:
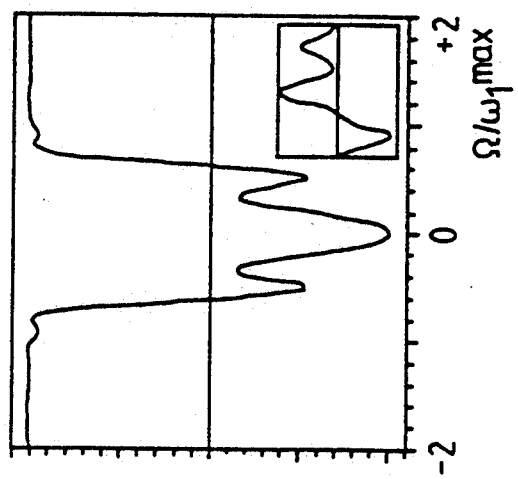
Figure 2B:
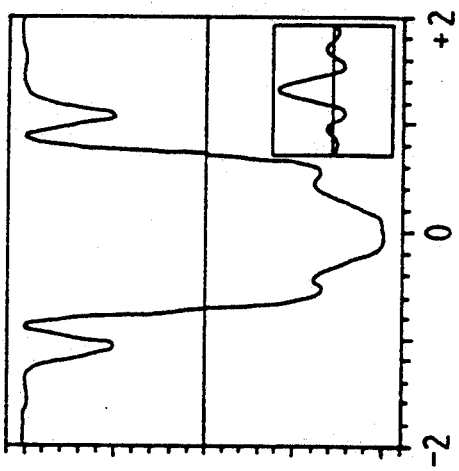
Figure 2A:
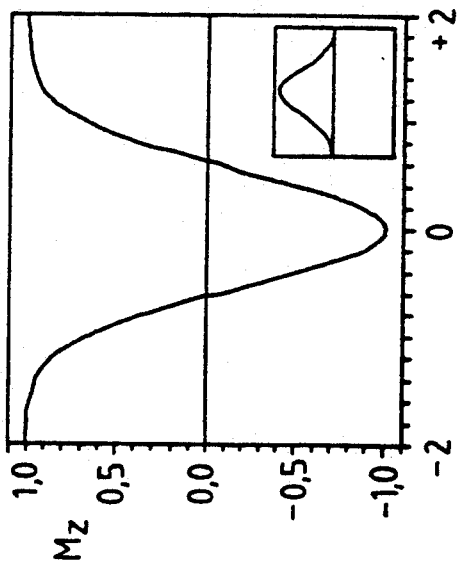
Figure 3A:
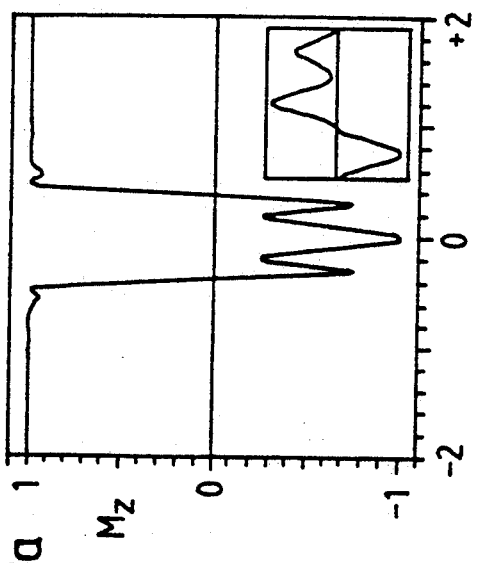
FIG. 3 shows the $M_z$ responses to an inversion pulse cascade according to the invention proceeding from a start function (a) as well as after various optimization cycles (b), (c), (d).
Figure 3B:
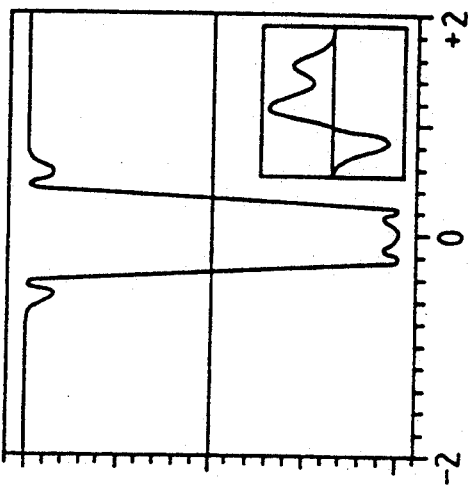
Figure 3C:
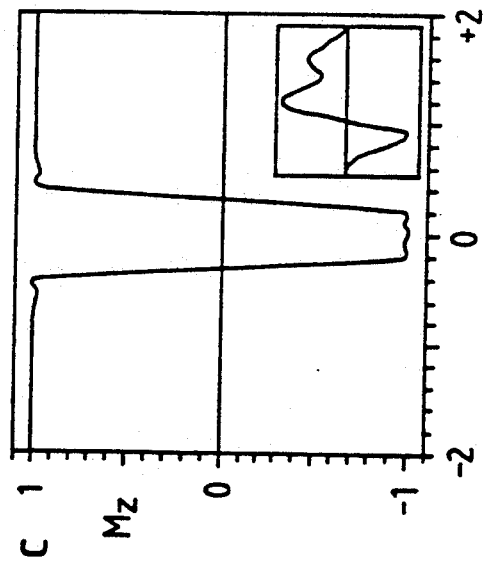
Figure 3D:
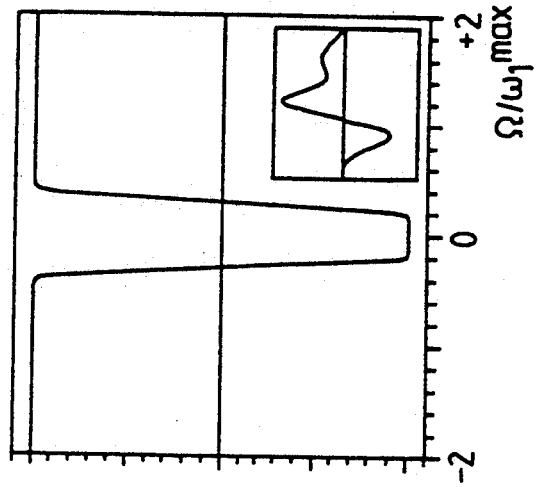

In FIG. 2, the $M_z$ magnetization as a function of the standardized frequency shift is compared after application (a) of a 180° Gaussian pulse, (b) a 180° Sinc pulse and (c) the cascade according to equation (3). The Gaussian pulse was cut off at 5% of $w_1^{max}$, the Sinc pulse had four zero crossings on each side of the maximum and the cascade had the parameters of cycle 0 in Table 1. Although the result of the cascade of FIG. 2C within the chosen band width is anything but perfect, the missing excitation outside of the desired band width shows an improvement over the individual Gaussian pulse and the Sinc function. The sequence $G(270°_{-x}) G(270°_x) G(180°_x)$ was used, therefore, as a starting point for an optimization.

FIGS. 3A to D show the $M_z$ magnetization profiles after successive cycles in the optimization procedure. There, (a) is the start function, (b), (c) and (d) are the results of the first, second and third optimization cycle, the latter being the finally accepted inversion cascade $G^3$. The parameters for the resulting pulses are presented in Table 1. For each optimization cycle (150 iterations) there are defined two error functions $f^{in}$ and $f^{out}$, one for the isochromates within and one for the isochromates outside the excitation and inversion rectangles, respectively:

$$\Delta^{in} = \Sigma_{k<(1-m)}f^{in}(M_k) \qquad [4]$$

$$\Delta^{out} = \Sigma_{k>(1+m')}f^{out}(M_k) \qquad [5]$$

There, $M_k$ is the magnetization response for $t=t_p$ at the k-th offset and 1 is the point at which the $M_z$ response runs through 0 (only for inversion). The intervals m and m' corresponding to a small transition zone, in which the response can move freely without contributing to the error function. The error functions are defined as $$f_{inv}^{out}(M_k)=f_{exc}^{out}(M_k)=(M_{kx}^2+M_{ky}^2)^a \qquad [6]$$

$$f_{inv}^{in}(M_k)=b(1+M_{kz}) \qquad [7]$$

$$f_{exc}^{in}(M_k)=c[(1-M_{kx})^2+dM_{ky}^2]^g+h(M_{kz}^2+M_{ky}^2) \qquad [8]$$

in which the subscripts inv and exc relate to functions that are used for the optimization of inversion and excitation pulses, respectively. The parameters a-h, which define the error functions according to equations (6) to (8) can be changed from cycle to cycle during the optimization and are given in Tables 1 and 2 together with the values m and m' as well as the parameters for each individual pulse in the cascade, the latter parameters being represented in the form of the position $t_k^{max}$ of the k-th pulse in units of the time duration $t_p$ of the sequence, the relative amplitude $w_k^{max}$ and the line width $\Delta t_k^{\frac{1}{2}}$ likewise in units of $t_p$. Let it be heeded that in each case either c or h in equation (8) is zero. The optimization was carried out for 80 isochromates and each response was calculated by obtaining a numerical solution of the Bloch equations with 200 equal time intervals in the integration. The frequency offsets are chosen so that 1 lies at about the 25th isochromate, and the error function is normalized in order to take into account any variations in 1 from iteration to iteration. Each optimization cycle consists of 150 iterations of a Simplex minimization of the error function.

In FIG. 3A to D there are also shown the pulse forms that are yielded after each cycle, so that it is possible to make visible the gradual optimization of the pulse. The last inversion pulse, which is called $G^3$, has the parameters given in Table 1 and is rather similar to the initial value in cycle 0. To obtain the present result only, three cycles of the optimization procedure are needed, which require approximately 15 minutes of c.p.u. time on a VAX 8550 cluster rated at 14 mips.

The $G^3$ cascade can be used not only for the inversion, but also as a refocusing pulse. Although the pulse was not optimized for this purpose, it nevertheless performs well also in this respect. This property is used in the following for the build-up of excitation pulses.

A further aim is to find a pulse which in a selected frequency interval can convert the longitudinal magnetization into transverse magnetization with the least possible phase dispersion. Outside the chosen interval the output state should be disturbed as little as possible. These requirements can be summarized in the expression "rectangular in-phase excitation". Hitherto, no suitable pulse cascade with only three Gaussian pulses has yet been found for this purpose. The simplest four-pulse cascade is a usual type 270° Gaussian excitation pulse, upon which there follows a $G^3$-cascade as a refocusing pulse.

$$G\{270°_x\}G^3_x \qquad [9]$$

This cascade was used as starting value. The phase of a cascade is to be indicated in the following by a subscript which represents the phase of the first individual pulse. The total on-resonance flip angle of the sequence in equation (9), therefore, is +90°. The course of the optimization is shown in Table 2. Since excitation by its nature presents a more difficult problem, the optimization converged more slowly and required 11 cycles and about 90 minutes of c.p.u. time.

Figures 4A, 4B:
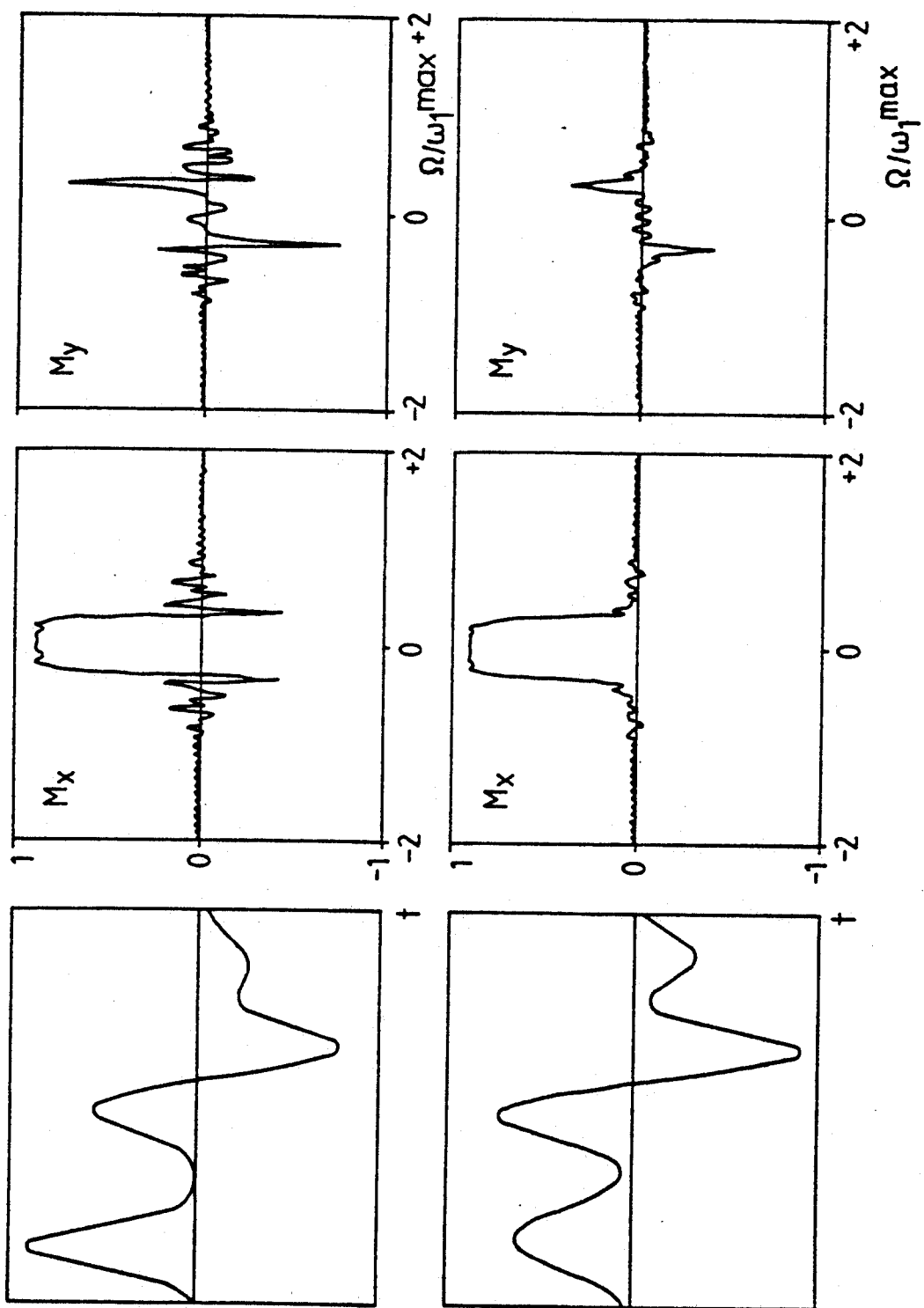
FIG. 4 shows.

FIG. 4 shows the responses to the start pulse (a) and to the final pulse (b), as it was generated by the optimization. The latter is called $G^4$ in the following. If one defines, as a useful band width the range in which the amplitude $M_{xy}$ exceeds 90% of the maximal value, the maximal phase deviation of the $G^4$ pulse in this window amounts to less than 5°.

Experiments with Gaussian pulse cascades were carried out on a Bruker AM-400 spectrometer which was outfitted with an arrangement for selective excitation of Oxford Research Systems (Series No. H 1657/0013). The pulse shapes were generated by a Pascal program which runs on the Aspect 3000 computer, which generates a data file that can be used by the Bruker SHAPE-PACKAGE, in order to create data for the wave-form memory. The generation of the enveloping functions in the case of inversion or excitation is reduced there to the simple entering of the nine or twelve relevant parameters, which are given in each case at the end of Table 1 or 2, respectively.

The little boxes inserted in FIGS. 1 to 3 as well as the left boxes in FIG. 4 show the envelope of the Gaussian pulse cascade used in each case.

Figure 5A:
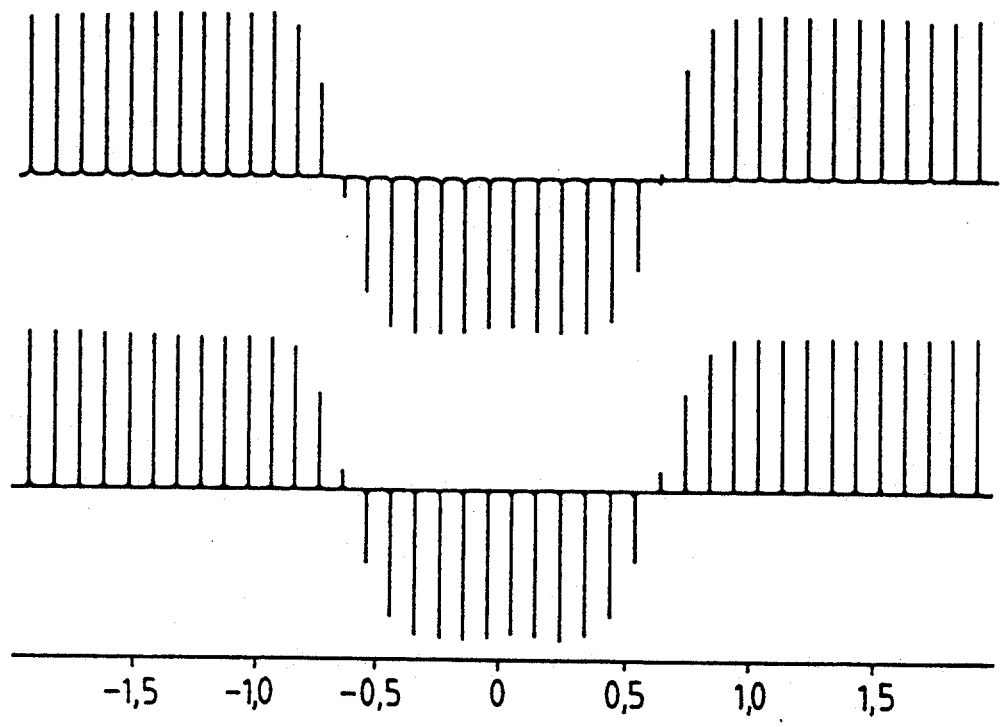

FIG. 5A shows the experimental behavior of the $G^3$ cascade. The results are obtained by applying the sequence $$G^3\Phi - 90° - \text{acquisition}$$

in which the 90° pulse is an ordinary hard nonselective pulse. The position of the proton resonance of benzene (doped with $Cr(acac)_3$) was changed by stepwise incrementing of the transmitter frequency. The phase of the $G^3$ cascade was turned through $\Phi=0°$, 90°, 180° and 270°, while the receiver phase was held constant in order to assure that only the Z-component of the magnetization generated by the $G^3$ cascade was measured. The agreement with the theory is excellent. In the upper diagram of FIG. 5 there is shown the actual experimental result, while the lower diagram of FIG. 5 shows the simulation of this experiment. The incomplete inversion in the center is a manifestation of the RF inhomogeneity in the sample, which is represented by a Lorentz distribution of the flip angles with a half-value width of $w_1 = 0.12 \cdot w_1^{nominal}$. The RF inhomogeneity has only a slight effect on the resulting profiles, which was likewise predicted from the theory.

Figure 5B:
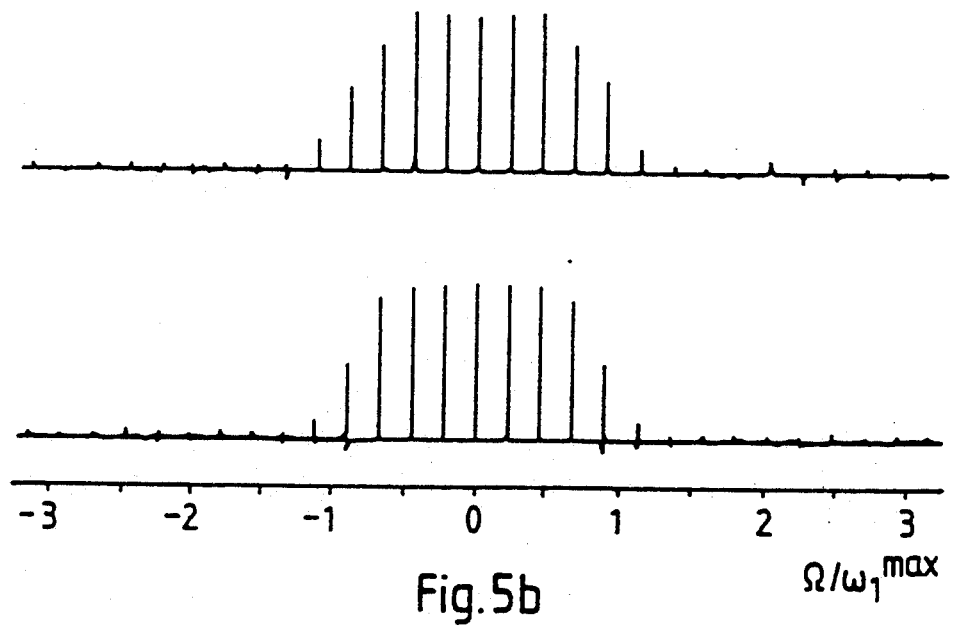

FIG. 5B shows a similar set of results for the $G^4$ excitation cascade. These were obtained by the use of a simple $G^4$ acquisition sequence and stepwise incrementing of the frequency of the transmitter, as described above. Again, the agreement of theory and experiment is nearly exact. No frequency-dependent phase correction was performed on these spectra. One should heed that the pulse response has a constant phase up to the limit of the excitation band width.

For comparison, FIG. 6 shows the simulated behavior (a) of a single 90° Gaussian pulse, (b) of a 270° Gaussian pulse and (c) of the $G^4$ excitation cascade. It is evident that the cascade presents a considerable improvement both for the profile itself and also for the phase properties of the pulse response.

The method of the invention, especially the use of the $G^3$ inversion cascade and the $G^3$ excitation cascade, can also be used as part of imaging methods in NMR tomography. Since the pulse sequences of the invention can be generated easily experimentally, also their use in multidimensional NMR spectroscopy, especially in volume selective NMR spectroscopy, is advantageous. The sequence of n RF pulses according to the invention can, in particular, also be part of a pulse sequence for correlated NMR spectroscopy (COSY) or of a NOESY pulse sequence.

Generally, instead of the Gaussian pulses described in detail above other RF pulses, with substantially bell-curve shaped amplitude distribution which may even be slightly asymmetrical, can also be used as components of the RF pulse sequence according to the invention. Such a bell curve form is described, for example, also by the well known Lorentz function:

$$S_k(t) = w_k^{max}/\pi \cdot a_k/[a_k^2 + (t - t_k^{max})^2]$$

FIG. 7 is a schematic diagram of an NMR spectrometer 1 in accordance with the invention, comprising an RF pulse driver 2 containing a memory 3, and driving an RF pulse generator 4.

TABLE 1

| Cycle | Error function | | | | | Pulse No. (k) | | |
|---|---|---|---|---|---|---|---|---|
| | m | m' | a | b | | 1 | 2 | 3 |
| 0 | | | | | $t_k^{max}/t_p$ | 16.6 | 50.0 | 83.3 |
| | | | | | $w_k^{max}$ | −1.00 | 1.00 | 0.66 |
| | | | | | $\Delta t_k^{\frac{1}{2}}/t_p$ | 16.0 | 16.0 | 16.0 |
| 1 | 2 | 2 | ½ | 15 | $t_k^{max}/t_p$ | 23.3 | 45.8 | 73.8 |
| | | | | | $w_k^{max}$ | −1.00 | 1.10 | 0.68 |
| | | | | | $\Delta t_k^{\frac{1}{2}}/t_p$ | 16.8 | 20.4 | 15.7 |
| 2 | 2 | 2 | ½ | 5 | $t_k^{max}/t_p$ | 27.5 | 48.6 | 77.3 |
| | | | | | $w_k^{max}$ | −1.00 | 1.04 | 0.59 |
| | | | | | $\Delta t_k^{\frac{1}{2}}/t_p$ | 18.6 | 20.9 | 20.0 |
| 3 | 2 | 2 | ½ | 15 | $t_k^{max}/t_p$ | 28.7 | 50.8 | 79.5 |
| | | | | | $w_k^{max}$ | −1.00 | 1.37 | 0.49 |
| | | | | | $\Delta t_k^{\frac{1}{2}}/t_p$ | 18.9 | 18.3 | 24.3 |

TABLE 2

| Cycle | Error function | | | | | | | | Pulse No. (k) | | | |
|---|---|---|---|---|---|---|---|---|---|---|---|---|
| | m | m' | a | c | d | g | h | | 1 | 2 | 3 | 4 |
| 0 | | | | | | | | $t_k^{max}/t_p$ | 14.2 | 49.1 | 64.9 | 85.3 |
| | | | | | | | | $w_k^{max}$ | 1.00 | 0.64 | −0.87 | −0.31 |
| | | | | | | | | $\Delta t_k^{\frac{1}{2}}/t_p$ | 12.2 | 13.5 | 13.1 | 17.42 |
| 1 | 2 | 2 | 1 | 0 | 0 | 0 | 3 | $t_k^{max}/t_p$ | 13.4 | 49.9 | 64.7 | 85.2 |
| | | | | | | | | $w_k^{max}$ | 0.97 | 0.65 | −0.86 | −0.35 |
| | | | | | | | | $\Delta t_k^{\frac{1}{2}}/t_p$ | 12.1 | 14.1 | 12.6 | 15.7 |
| 2 | 2 | 2 | 1 | 0 | 0 | 0 | 6 | $t_k^{max}/t_p$ | 13.2 | 49.8 | 64.3 | 85.0 |
| | | | | | | | | $w_k^{max}$ | 0.93 | 0.67 | −0.92 | −0.33 |
| | | | | | | | | $\Delta t_k^{\frac{1}{2}}/t_p$ | 12.7 | 14.1 | 12.3 | 15.7 |
| 3 | 4 | 2 | 1 | 1 | 6 | 1 | 0 | $t_k^{max}/t_p$ | 13.5 | 50.2 | 65.0 | 85.0 |
| | | | | | | | | $w_k^{max}$ | 0.97 | 0.75 | −0.97 | −0.36 |
| | | | | | | | | $\Delta t_k^{\frac{1}{2}}/t_p$ | 12.9 | 13.2 | 12.2 | 15.6 |
| 4 | 3 | 2 | 1 | 1 | 6 | 1 | 0 | $t_k^{max}/t_p$ | 18.1 | 50.2 | 65.6 | 87.5 |
| | | | | | | | | $w_k^{max}$ | 0.81 | 0.71 | −1.02 | −0.30 |
| | | | | | | | | $\Delta t_k^{\frac{1}{2}}/t_p$ | 13.6 | 13.1 | 10.9 | 14.1 |
| 5 | 2 | 2 | 1 | 1 | 6 | 1 | 0 | $t_k^{max}/t_p$ | 18.7 | 50.7 | 66.1 | 87.7 |
| | | | | | | | | $w_k^{max}$ | 0.76 | 0.75 | −0.99 | −0.36 |
| | | | | | | | | $\Delta t_k^{\frac{1}{2}}/t_p$ | 14.6 | 14.1 | 12.0 | 13.7 |
| 6 | 1 | 1 | 1 | 1 | 6 | 1 | 0 | $t_k^{max}/t_p$ | 16.5 | 49.4 | 65.3 | 89.3 |
| | | | | | | | | $w_k^{max}$ | 0.70 | 0.72 | −0.95 | −0.37 |
| | | | | | | | | $\Delta t_k^{\frac{1}{2}}/t_p$ | 16.3 | 15.1 | 13.2 | 14.5 |
| 7 | 1 | 1 | ½ | 1 | 6 | ½ | 0 | $t_k^{max}/t_p$ | 16.7 | 49.2 | 65.2 | 89.8 |
| | | | | | | | | $w_k^{max}$ | 0.63 | 0.74 | −0.91 | −0.35 |
| | | | | | | | | $\Delta t_k^{\frac{1}{2}}/t_p$ | 17.4 | 14.0 | 13.1 | 14.7 |
| 8 | 1 | 1 | ½ | 1 | 3 | ½ | 0 | $t_k^{max}/t_p$ | 17.6 | 49.3 | 65.4 | 89.7 |
| | | | | | | | | $w_k^{max}$ | 0.63 | 0.75 | −0.89 | −0.35 |
| | | | | | | | | $\Delta t_k^{\frac{1}{2}}/t_p$ | 17.7 | 13.7 | 13.1 | 14.7 |
| 9 | 1 | 1 | ½ | 1 | 0.5 | ½ | 0 | $t_k^{max}/t_p$ | 16.6 | 48.6 | 64.7 | 88.9 |
| | | | | | | | | $w_k^{max}$ | 0.58 | 0.74 | −0.85 | −0.34 |
| | | | | | | | | $\Delta t_k^{\frac{1}{2}}/t_p$ | 17.7 | 13.6 | 12.7 | 14.4 |
| 10 | 2 | 2 | 1 | 4 | 0.71 | ½ | 0 | $t_k^{max}/t_p$ | 17.2 | 48.9 | 65.05 | 89.1 |
| | | | | | | | | $w_k^{max}$ | 0.59 | 0.72 | −0.88 | −0.34 |
| | | | | | | | | $\Delta t_k^{\frac{1}{2}}/t_p$ | 17.6 | 12.9 | 12.1 | 13.4 |
| 11 | 2 | 2 | 1 | ·4 | 0.84 | ½ | 0 | $t_k^{max}/t_p$ | 17.7 | 49.2 | 65.3 | 89.2 |
| | | | | | | | | $w_k^{max}$ | 0.62 | 0.72 | −0.91 | −0.33 |
| | | | | | | | | $\Delta t_k^{\frac{1}{2}}/t_p$ | 17.2 | 12.9 | 11.9 | 13.9 |

We claim:

1. A method for generating a spectrum of nuclear magnetic resonance signals comprising the steps of:
   a) selecting a pulse sequence with a number n of at least 2 but not more than 10 amplitude modulated bell shaped RF pulses, each RF pulse comprising an amplitude $w_k{}^{max}$, an extremum position $t_k{}^{max}$, and a width $a_k$;

b) varying the amplitude, extremum position, and width of each pulse to minimize a deviation of a signal response frequency space envelop from a rectangular function;

c) radiating the pulse sequence onto a sample located in a homogeneous static magnetic field to produce a nuclear magnetic resonance signal response with an approximately rectangular frequency space envelope.

2. The method according to claim 1, wherein the minimization of the deviation of the envelope is accomplished by use of a numerical fit program on an automatic data processing installation.

3. The method according to claim 1, wherein the minimization of the deviation of the envelope is accomplished by optimization of a predetermined error function, which describes the deviation of the envelope from a rectangular function.

4. The method according to claim 3, wherein the minimization is stopped when the absolute value of the error function exceeds a predetermined limit value.

5. The method according to claim 1, wherein the sequence contains RF pulses whose amplitude distribution follows the form of a Lorentz curve.

6. The method according to claim 1, wherein the sequence contains RF pulses whose amplitude distribution follows the form of a Gaussian curve.

7. The method according to claim 1, wherein $n=3$ and the method is used for the selective inversion of nuclear magnetic moments.

8. The method according to claim 7, wherein the pulse sequence has a time duration $t_p$, a kth pulse has a half pulse width $\delta t_k{}^{\frac{1}{2}}$ at a half pulse amplitude $w_k{}^{max}/2$, $a_k = \ln 2/(\delta t_k{}^{\frac{1}{2}})^2$, and $w_k{}^{max}$, $t_k{}^{max}/t_p$ and $\delta t_k{}^{\frac{1}{2}}/t_p$ have values in ranges:

$1.2 < w_2{}^{max}/w_1{}^{max} < 1.5$; $0.3 < w_3{}^{max}/w_1{}^{max} < 0.7$ $15 < \delta t_1{}^{\frac{1}{2}}/t_p < 25$; $15 < \delta t_2{}^{\frac{1}{2}}/t_p < 25$; $20 < \delta t_3{}^{\frac{1}{2}}/t_p < 30$;

$20 < t_1{}^{max}/t_p < 40$; $40 < t_2{}^{max}/t_p < 60$;
$70 < t_3{}^{max}/t_p < 90$.

9. The method according to claim 8, wherein $w_k{}^{max}$, $t_k{}^{max}$, and $\delta t_k{}^{\frac{1}{2}}/t_p$ have values:

$w_1{}^{max} = -1.00$; $w_2{}^{max} = 1.37$; $w_3{}^{max} = 0.49$;

$\delta t_1{}^{\frac{1}{2}}/t_p = 18.9$; $\delta t_2{}^{\frac{1}{2}}/t_p = 18.3$; $\delta t_3{}^{\frac{1}{2}}/t_p = 24.3$;

$t_1{}^{max}/t_p = 28.7$; $t_2{}^{max}/t_p = 50.8$; $t_3{}^{max}/t_p = 79.5$.

10. The method according to claim 1, wherein $n=4$ and the method is used for an inphase excitation of transverse magnetization.

11. The method according to claim 10, wherein the pulse sequence has a time duration $t_p$, the kth pulse has a half pulse width $\delta t_k{}^{\frac{1}{2}}$ at a half pulse amplitude $w_k{}^{max}/2$, $a_k = \ln 2/(\delta t_k{}^{\frac{1}{2}})^2$, and $w_k{}^{max}$, $t_k{}^{max}/t_p$ and $\delta t_k{}^{\frac{1}{2}}/t_p$ have values in ranges:

$0.95 < w_2{}^{max}/w_1{}^{max} < 1.35$;
$-1.7 < w_3{}^{max}/w_1{}^{max} < -1.3$;
$-0.7 < w_4{}^{max}/w_1{}^{max} < -1.4$;

$15 < \delta t_1{}^{\frac{1}{2}}/t_p < 20$; $10 < \delta t_2{}^{\frac{1}{2}}/t_p < 15$; $10 < \delta t_3{}^{\frac{1}{2}}/t_p\ 15$;
$10 < \delta t_4{}^{\frac{1}{2}}/t_p < 20$;

$5 < t_1{}^{max}/t_p < 25$; $40 < t_2{}^{max}/t_p < 60$;
$55 < t_3{}^{max}/t_p < 75$; $75 < t_4{}^{max}/t_p < 95$.

12. The method according to claim 11, wherein $w_k{}^{max}$, $t_k{}^{max}$ and $\delta t_k{}^{\frac{1}{2}}/t_p$ have values:

$w_1{}^{max} = 0.62$; $w_2{}^{max} = 0.72$; $w_3{}^{max} = -0.91$;

$w_4{}^{max} = -0.33$ $\delta t_1{}^{\frac{1}{2}}/t_p = 17.2$; $\delta t_2{}^{\frac{1}{2}}/t_p = 12.9$; $\delta t_3{}^{\frac{1}{2}}/t_p = 11.9$;

$\delta t_4{}^{\frac{1}{2}}/t_p = 13.9$;

$t_1{}^{max}/t_p = 17.7$; $t_2{}^{max}/t_p = 49.2$; $t_3{}^{max}/t_p = 65.3$;

$t_4{}^{max}/t_p = 89.2$.

13. The method according to claim 1 further comprising the step of:

d) generating section images for an NMR tomograph.

14. The method according to claim 1 further comprising the step of:

d) generating a multidimensional NMR spectroscopy.

15. The method according to claim 14, wherein the NMR spectroscopy is volume selective.

16. The method according to claim 14, wherein the sequence of n RF pulses is part of a NOESY pulse sequence.

17. The method according to claim 14, wherein the sequence of n RF pulses is part of a COSY pulse sequence.

18. A nuclear magnetic resonance spectrometer with an RF pulse generator and an arrangement for the drive of the RF pulse generator, the arrangement comprising a memory for the storage of data sets for the generation of RF pulse sequences wherein the memory comprises a data set for the generation of a pulse sequence with a number n of at least two but not more than 10 amplitude modulated bell shaped RF pulses, each RF pulse comprising an amplitude $w_k{}^{max}$, an extremum position $t_k{}^{max}$, and a width $a_k$ and, in advance, the amplitude distribution of the entire pulse sequence has been determined in a suitable optimization procedure under a criterion of a minimization of a deviation of an envelope of a nuclear magnetic resonance signal response in frequency space from a rectangular function by variation, for each pulse, of $w_k{}^{max}$, $t_k{}^{max}$, and $a_k$.

* * * * *

UNITED STATES PATENT AND TRADEMARK OFFICE
CERTIFICATE OF CORRECTION

PATENT NO. : 5,285,159
DATED : February 8, 1994
INVENTOR(S) : Geoffrey Bodenhausen & Lyndon Emsley It is certified that error appears in the above-indentified patent and that said Letters Patent is hereby corrected as shown below:

Column 9, line 22, "$G^3$" should be —$G^4$—.
Column 12, line 7, "1.4" should be —0.4—.

Signed and Sealed this

Second Day of August, 1994

*Attest:*

BRUCE LEHMAN

*Attesting Officer*      Commissioner of Patents and Trademarks